(12) United States Patent
Kodaira et al.

(10) Patent No.: US 6,480,383 B2
(45) Date of Patent: Nov. 12, 2002

(54) ELECTRONIC COMPONENT COOLING APPARATUS

(75) Inventors: Yuichi Kodaira, Ueda (JP); Haruhisa Maruyama, Toshima-ku (JP); Naoko Ishiwatari, Toshima-ku (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 09/962,666

(22) Filed: Sep. 25, 2001

(65) Prior Publication Data

US 2002/0039281 A1 Apr. 4, 2002

(30) Foreign Application Priority Data

Sep. 29, 2000 (JP) .......................................... 2000-299927

(51) Int. Cl.[7] ................................................. H05K 7/20
(52) U.S. Cl. ........................ 361/697; 361/694; 361/695; 361/703; 361/704; 361/709; 257/718; 257/722; 257/727; 174/15.1; 174/16.1; 174/16.3; 165/80.3; 165/104.33
(58) Field of Search .................................. 361/695, 697, 361/704, 717–719, 722, 723; 257/706, 717–719, 722; 165/80.2, 80.3, 185; 174/16.1, 16.3

(56) References Cited

U.S. PATENT DOCUMENTS

| | | | |
|---|---|---|---|
| 5,309,983 A | | 5/1994 | Bailey |
| 5,335,722 A | * | 8/1994 | Wu ............................... 165/122 |
| 5,494,098 A | | 2/1996 | Morosas |
| 5,495,392 A | * | 2/1996 | Shen ........................... 361/697 |
| 5,519,574 A | | 5/1996 | Kodama et al. |
| 5,616,998 A | | 4/1997 | Kodama et al. |
| 5,724,228 A | * | 3/1998 | Lee ............................... 361/697 |
| 5,734,553 A | * | 3/1998 | Hong ........................... 361/697 |
| 5,740,014 A | | 4/1998 | Lin |
| 5,835,347 A | | 11/1998 | Chu |
| D403,760 S | | 1/1999 | Kodaira et al. |
| 5,926,367 A | * | 7/1999 | Gutierrez et al. ........... 361/695 |
| 5,943,209 A | * | 8/1999 | Liu ............................... 361/695 |
| 6,109,340 A | * | 8/2000 | Nakase et al. .............. 165/80.3 |
| 6,160,704 A | * | 12/2000 | Rusate ......................... 361/697 |
| 6,199,624 B1 | * | 3/2001 | Wotring ...................... 165/80.3 |
| 6,223,970 B1 | * | 5/2001 | Chen ........................... 228/44.3 |

FOREIGN PATENT DOCUMENTS

JP    11-284116    10/1999

* cited by examiner

*Primary Examiner*—Boris Chervinsky
(74) *Attorney, Agent, or Firm*—Rankin, Hill, Porter & Clark LLP

(57) ABSTRACT

An electronic component cooling apparatus capable of firmly mounting a fan unit mounting frame on a heat sink without increasing mechanical strength of the fan unit mounting frame. The fan unit mounting frame includes a pair of mounting legs provided thereon with hooks, which are engaged with hook engagements provided on a base of the heat sink. A top plate of the fan unit mounting frame is provided thereon with projections acting as a first pivotal movement preventing engagement structure and fitted in gaps defined between adjacent radiation fins of a radiation fin unit. Also, the top plate is provided thereon with projections which are abutted against end surfaces of the radiation fins positioned in a second direction, to thereby act as a second pivotal movement preventing engagement structure for preventing pivotal movement of the top plate in the second direction.

15 Claims, 6 Drawing Sheets

ELECTRONIC COMPONENT COOLING APPARATUS

BACKGROUND OF THE INVENTION

This invention relates to an electronic component cooling apparatus for cooling an electronic component such as an MPU or the like, and more particularly to an electronic component cooling apparatus of the type that a heat sink on which an electronic component is mounted is forcibly cooled by air fed from a fan unit.

An electronic component cooling apparatus which has a heat sink including a plurality of radiation fins arranged so as to be spaced from each other at intervals while being parallel to each other incorporated therein has been conventionally known in the art, as disclosed in U.S. Pat. Nos. 5,309,983, 5,519,574 (see FIG. 3 of the patent), U.S. Pat. No. Design 403,760, U.S. Pat. Nos. 5,494,098 and 5,835,347. The conventional electronic component cooling apparatus as shown in the above cases, is constructed so as to discharge air in both directions in which each of the radiation fins extends.

Another conventional electronic component cooling apparatus is disclosed in U.S. Pat. No. 5,740,014, which is so constructed that a plurality of parting slits are formed so as to be perpendicular to all of radiation fins arranged on a base of a heat sink in a manner to be parallel to each other, to thereby divide the radiation fins into fine plate-like strips. Then, air is blown against the strips from an axial fan to increase cooling efficiency of the electronic component cooling apparatus. Also, in the electronic component cooling apparatus, the radiation fins arranged in parallel to each other are entirely or substantially entirely contacted at an end thereof with a top plate of a fan unit mounting frame for mounting a fan unit thereon.

A further conventional electronic component cooling apparatus is disclosed in U.S. Pat. Nos. 5,615,998 and Des. 403,760. The cooling apparatus disclosed includes an engagement structure which permits a plurality of engaging sections provided on a casing of a fan unit and a plurality of engaged sections provided on a heat sink to be engaged with each other by merely approaching the casing of the fan unit to the heat sink when the fan unit is mounted on the heat sink.

Still another conventional electronic component cooling apparatus is proposed as disclosed in Japanese Patent Application Laid-Open Publication No. 284116/1999. The cooling apparatus disclosed is so constructed that an end of each of plural radiation fins and a top plate of a fan unit mounting frame for mounting a fan unit thereon are arranged so as to be spaced from each other at a predetermined interval to define an air flow space therebetween.

Currently, an electronic equipment such as a CPU or the like generally tends to generate more heat than before, and it is highly required to enhance cooling performance of an electronic component cooling apparatus. To this end, it is proposed that radiation fins each are made of a copper plate relatively reduced in thickness which exhibits enhanced thermal conductivity. However, when the radiation fins are arranged so as to provide an interval between the radiation fins and a top plate of a fan unit mounting frame for mounting a fan unit thereon while being reduced in thickness, the radiation fins fail to be positively used as a support for the frame. This is solved by rendering a mechanical structure of the fan mounting frame rigid. However, an increase in rigidity of the mechanical structure of the fan mounting frame leads to an increase in manufacturing cost of the frame, leading to a failure in demand for cost reduction.

SUMMARY OF THE INVENTION

The present invention has been made in view of the foregoing disadvantage of the prior art.

Accordingly, it is an object of the present invention to provide an electronic component cooling apparatus which is capable of firmly fixing a fan unit mounting frame to a heat sink, when radiation fins of the heat sink are not intended to be positively used as a support for the fan unit mounting frame.

It is another object of the present invention to provide an electronic component cooling apparatus which is capable of firmly fixing a fan unit mounting frame to a heat sink without increasing mechanical strength of the fan unit mounting frame.

It is a further object of the present invention to provide an electronic component cooling apparatus which is capable of changing a cooling performance thereof depending on a variation in temperature.

It is still another object of the present invention to provide an electronic component cooling apparatus which is capable of exhibiting enhanced heat dissipating performance as compared with heretofore.

It is yet another object of the present invention to provide an electronic component cooling apparatus which is capable of facilitating position ing between a fan unit mounting frame and a heat sink and ensuring firm engagement therebetween, not permitting the engagement to come off easily.

In accordance with the present invention, an electronic component cooling apparatus is provided. The electronic component cooling apparatus includes a heat sink, a fan unit and a fan unit mounting frame made of a synthetic resin material for mounting the fan unit on the heat sink. The heat sink includes a radiation fin unit including a plurality of radiation fins made of a material increased in thermal conductivity, as well as a base made of a material increased in thermal conductivity. The base is mounted on a front surface thereof with the radiation fin unit and on a rear surface thereof with an electronic component to be cooled. The radiation fins are arranged so as to extend in a first direction perpendicular to the front surface of the base and in a second direction perpendicular to the first direction and along the front surface of the base. The radiation fins are arranged so as to be spaced from each other at predetermined intervals in a third direction perpendicular to the first and second directions. The radiation fins each are fixed, to the base, at an end thereof positioned on one side in the first direction. The base is formed with a hook engagement at each of a pair of edges thereof positioned on both sides in the third direction.

The fan unit incorporated in the electronic component cooling apparatus feeds air for cooling the radiation fin unit. The fan unit includes an impeller including a plurality of blades and rotated by a motor and is arranged on the other side in the first direction mentioned above with respect to the radiation fin unit. The fan unit mounting frame for mounting the fan unit on the heat sink includes a top plate for supporting the fan unit thereon, a pair of side plates and at least a pair of mounting legs. The top plate is arranged outside the radiation fin unit so as to define a gap sufficient to provide an air flow space continuously extending on both sides in the second and third directions between the top plate and an end of each of the radiation fins positioned on the other side in the first direction. The top plate is provided with an air guide hole for guiding air sucked by the fan unit to the air flow space. The side plates are arranged so as to extend, toward the base, from a pair of ends of the top plate positioned on both sides in the third direction. The mounting legs each are connected at one end thereof to each of the side plates and provided at the other end thereof with a hook engaged with each of the hook engagements. The side plates and mounting legs are formed into a shape and dimensions which keep the side plates and mounting legs from fully covering side surfaces of the radiation fan unit positioned on both sides in the third direction.

The fan unit mounting frame includes a first pivotal movement preventing engagement structure which is engaged with the radiation fin unit to prevent the top plate from pivotally moving in the third direction and a second pivotal movement preventing engagement structure which is engaged with the radiation fin unit to prevent the top plate from pivotally moving in the second direction.

The above-described construction of the present invention permits air for cooling discharged from the fan unit to flow through the air flow space defined between the radiation fin unit and the top plate, gaps defined between the radiation fins and gaps defined between the side plates and outermost two of the radiation fins of the radiation fin unit, to thereby efficiently cool the radiation fins. In particular, the present invention is so constructed that air flowing through the air flow space is directly fed to the gaps between the respective adjacent two of the radiation fins of the radiation fin unit. This permits air of low temperature or cold air to be rapidly fed from the fan unit to the radiation fins arranged apart from the fan unit, to thereby significantly enhance cooling efficiency of the electronic component cooling apparatus.

In particular, in the electronic component cooling apparatus of the present invention, the hooks arranged on the mounting legs of the fan unit mounting frame are engaged with the hook engagements arranged on the base, to thereby prevent movement of the top plate of the fan unit mounting frame in the first direction. Also, the above-described arrangement of the first pivotal movement preventing engagement structure and second pivotal movement preventing engagement structure effectively prevents the top plate from moving in the second and third directions, so that the fan unit mounting frame may be firmly mounted, with increased resistance to deformation, on the heat sink without substantially increasing mechanical strength of the fan unit mounting frame.

Thus, the present invention ensures firm mounting of the fan unit mounting frame on the heat sink even when the radiation fin unit is formed by subjecting a thin metal plate to working or machining in order to enhance heat dissipating performance thereof and therefore the mechanical strength of the radiation fan unit is reduced. Such a radiation fin unit may be made by subjecting a single metal plate having a thickness which permits bending thereof to working. Such a radiation fin unit may be constructed by connecting the radiation fins to each other in order in such a manner that, of both ends of each of the radiation fins defined on both sides in said first direction, one end of the radiation fin positioned on the one side in the first direction is connected to an end of a first adjacent radiation fin positioned on the one side in the third direction by a first connection. which end of the first adjacent radiation fin is positioned on the one side in the first direction, and the other end of the radiation fin positioned on the other side in the first direction is connected to an end of a second adjacent radiation fin positioned on the other side in the third direction by a second connection, which end of the second adjacent radiation fin is positioned on the other side in the first direction. Such construction of the radiation fin unit permits the radiation fin unit to be readily made of a single metal plate.

In other words, the radiation fin unit may be configured into a meandering shape in such a manner that the radiation fins each are connected at an end thereof positioned on one side in the first direction to an end of a first adjacent radiation fin positioned on the one side by a first connection and at an end thereof positioned on the other side in the first direction to an end of a second adjacent radiation fin positioned on the other side in the first direction by a second connection. The first connection may be joined to the front surface of the base.

The first pivotal movement preventing engagement structure may be constituted by one or more projections fitted in one or more gaps defined between adjacent two of the radiation fins in the first direction.

When each of the projections is fitted in each of the gaps, the projection acts as an anchor caught by the radiation fin adjacent thereto when force toward both sides in the third direction is applied to the fan unit mounting frame, resulting in restraining pivotal movement of the top plate in the third direction.

A casing of the fan unit and the fan unit mounting frame may be formed so as to be integral with each other. However, this causes the casing and fan unit mounting frame to be complicated in configuration, leading to an increase in manufacturing cost. Thus, the casing of the fan unit is preferably formed separately from the fan unit mounting frame. In this instance, the plural projections may be arranged on the top plate so as to form at least one projection chain along a circumference of the air guide hole. When such a projection chain is arranged, the projection chain is formed on an outside thereof with an elongated slit so as to continuously extend along the projection chain. The top plate is deflected at a portion thereof on which the projections are formed so as to project toward the other side in the first direction while keeping the fan unit mounting frame mounted on the heat sink. More specifically, the projections each are formed into a width somewhat larger than that of each of the gaps, so that the projection is forcedly fitted in the gap. This permits the portion of the top plate on which the projection chain is formed to be deflected, so that the projections may be forced against the radiation fin unit. Such arrangement cooperates with the above-described engagement between the hooks of the mounting legs and the hook engagements of the heat sink to effectively prevent the fan unit mounting frame from moving toward the other side in the first direction.

Alternatively, the present invention may be so constructed that the projection chain is arranged outside the slit and the slit is provided on an inside thereof with a protrusion abutted against ends of the radiation fins positioned on the other side in the first direction. This permits the protrusion to be forced against the ends of the radiation fins using the above-described deflection. Such construction likewise effectively prevents movement of the fan unit mounting frame toward the other side in the first direction. In this instance, the projections each may be formed into a configuration which permits the projection to be loosely fitted in the gap. Also, in this instance, the second pivotal movement preventing engagement structure may be constituted by connection bars as described below.

The second pivotal movement preventing engagement structure may be constituted by a pair of protrusions arranged so as to extend from the top plate toward the base, to thereby be abutted against a part of end surfaces of each of the radiation fins positioned on both sides in the second direction, resulting in preventing pivotal movement of the radiation fin unit in the second direction. Such construction permits the protrusions in a pair to act as a stopper with a simple structure, to thereby prevent pivotal movement of the top plate of the fan unit mounting frame in the second direction, when force in the second direction is applied to the fan unit mounting frame.

In a preferred embodiment of the present invention, a pair of elongated connection bars may be arranged so as to connect a pair of ends of the side plates positioned on both sides in the second direction thereto, respectively. This prevents a reduction in mechanical strength of the fan unit mounting frame even when the fan unit mounting frame is made of a thinner material. In this instance, the connection bars may act also as the second pivotal movement preventing engagement structure. This results in the electronic component cooling apparatus being simplified in structure. In this instance, at least one short connection bar may be arranged so as to connect the connection bars and top plate to each other. This further enhances mechanical strength of the fan unit mounting frame without substantially obstructing flow of air for cooling.

The above-described configuration of the present invention permits air for cooling discharged from the fan unit to flow through the air flow space, the gaps, and the gaps defined between the side plates and each of the legs and the side surface of the radiation fin unit positioned on each of both sides in the third direction. This attains rapid and uniform cooling of the whole radiation fin unit.

The blades of the fan unit each may be positioned at a part thereof in the air flow space. This enhances cooling efficiency of the electronic component cooling apparatus.

In a preferred embodiment of the present invention, the legs each are connected to a central portion of each of the side plates. The side plates have a pair of auxiliary support legs abutted against the edges of the base so as to be positioned on both sides of the legs in the second direction. Such construction permits each of the auxiliary support legs to act as a reinforcing member, to thereby enhance mechanical strength of the fan unit mounting apparatus. An excessive increase in size of the auxiliary support legs obstructs flow of air for cooling. Thus, in order to avoid the problem, the auxiliary support legs are preferably formed into a size as large as possible while ensuring that it does not obstruct air flow.

The fan unit may be mounted on the top plate of the fan unit mounting frame through a removable engagement structure. Also, the fan unit may include a motor, an impeller rotated by the motor, a motor drive circuit for driving the motor and a temperature sensor arranged in a manner to be incorporated in or adjacent to the motor drive circuit, wherein the motor drive circuit controls a rotational speed of the motor depending on an output of the temperature sensor. This leads to a variation in air discharged from the fan unit depending on an ambient temperature, thus resulting in enhancing the cooling performance of the cooling apparatus.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Figure 1:
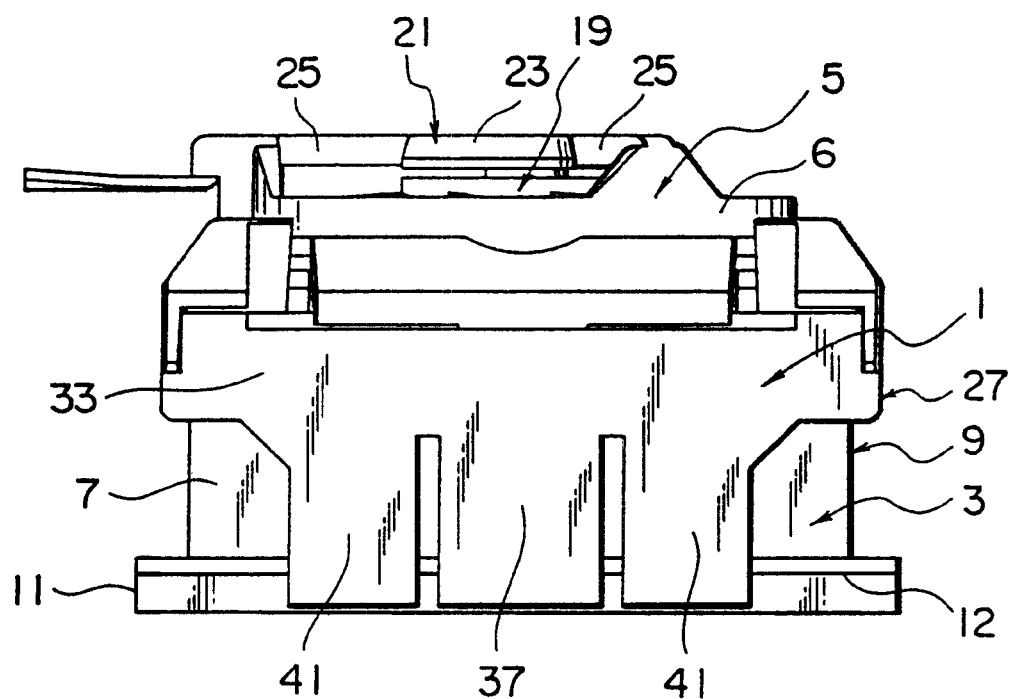
FIG. 1 is a front elevation view showing an embodiment of an electronic component cooling apparatus according to the present invention.
Figure 2:
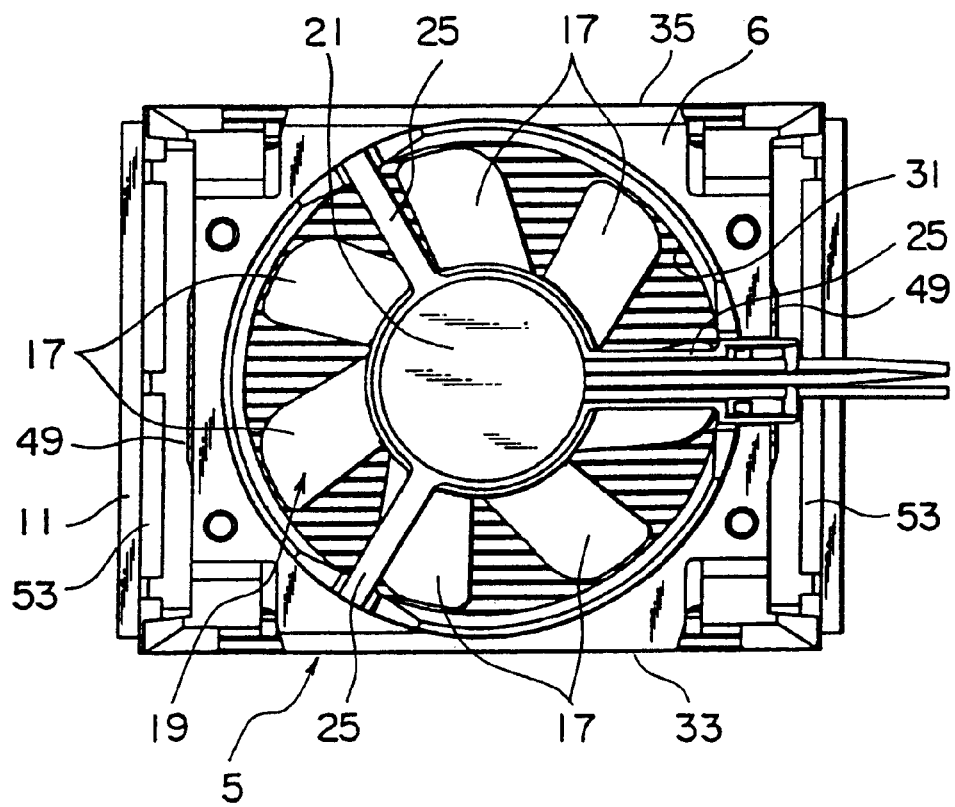
FIG. 2 is a plan view of the electronic component cooling apparatus shown in FIG. 1.
Figure 3:
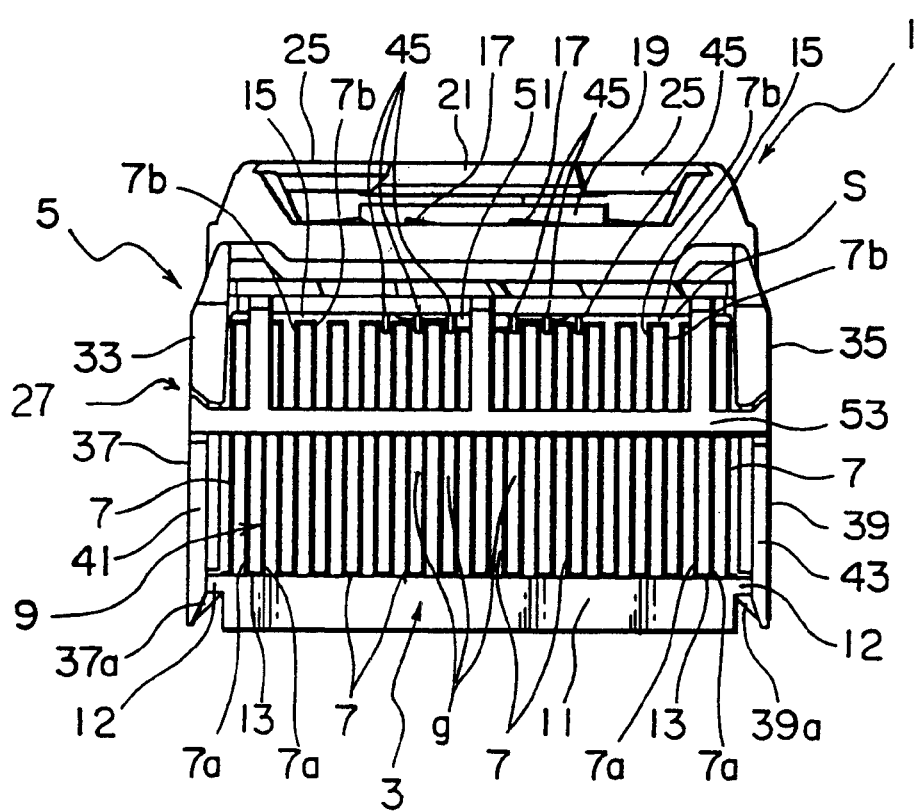
FIG. 3 is a right side elevation view of the electronic component cooling apparatus shown in FIG. 1.
Figure 4:
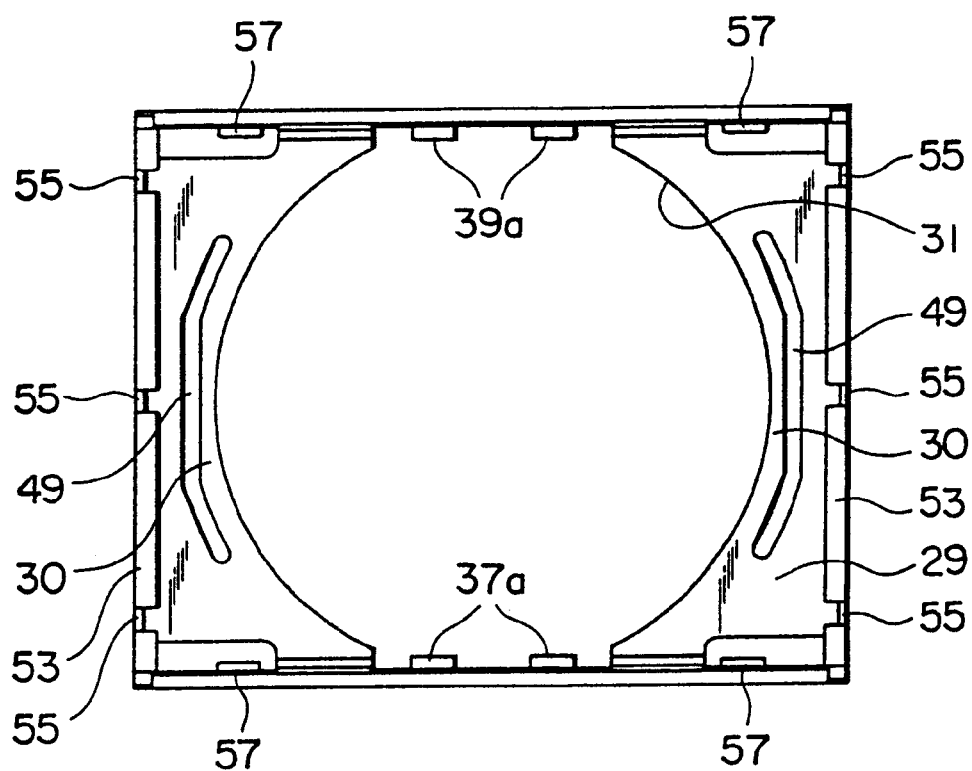
FIG. 4 is a plan view showing a fan unit mounting frame incorporated in the electronic component cooling apparatus of FIG. 1.
Figure 5:
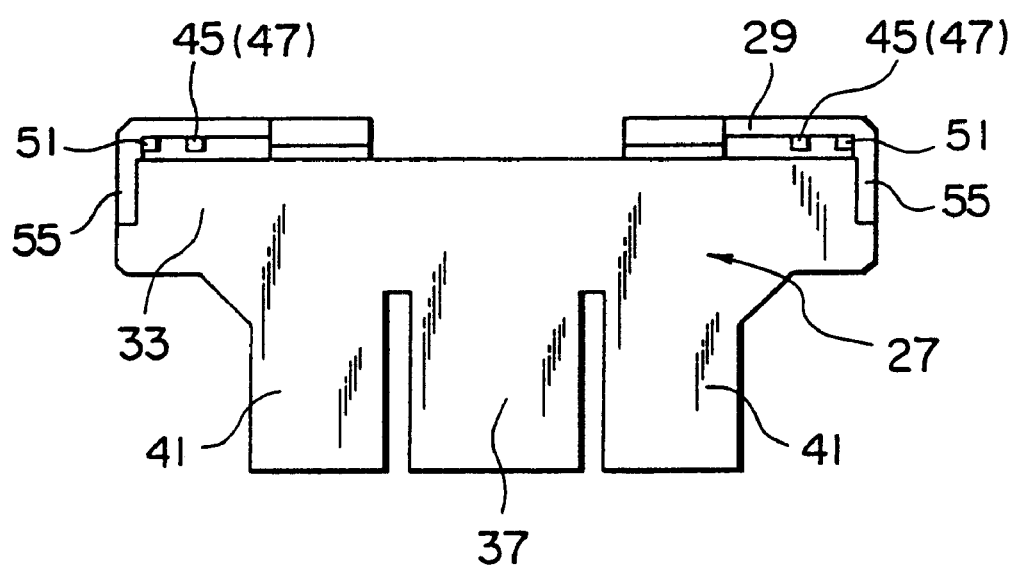
FIG. 5 is a front elevation view of the fan unit mounting frame shown in FIG. 4.
Figure 6:
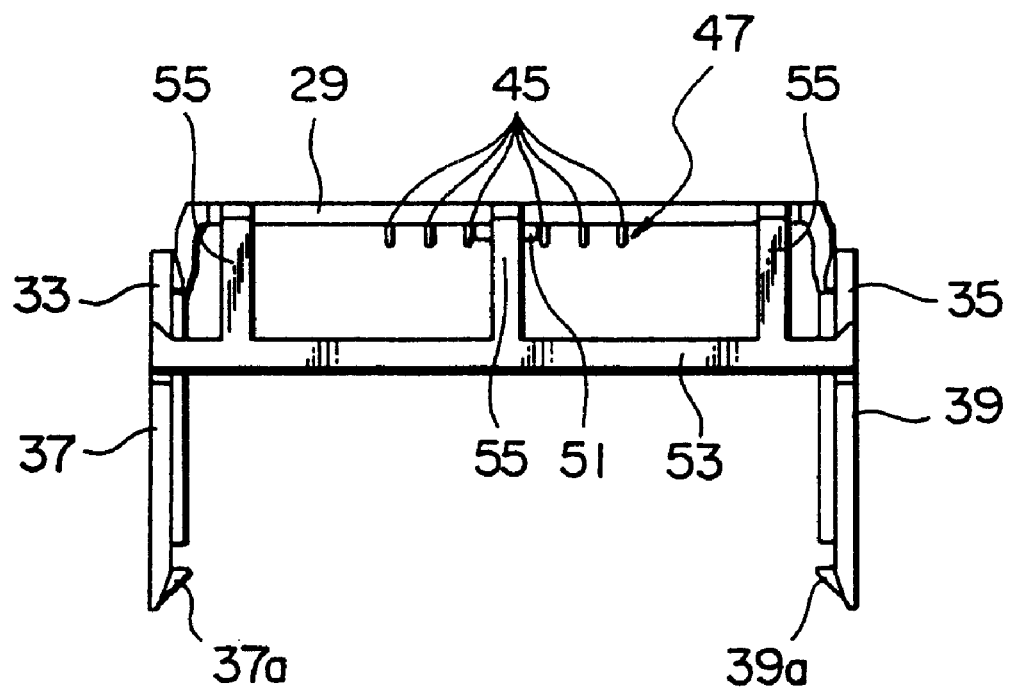
FIG. 6 is a right side elevation view of the fan unit mounting frame shown in FIG. 4.

Now, an electronic component cooling apparatus according to the present invention will be described with reference to FIGS. 1 to 6, wherein FIGS. 1 to 3 show an embodiment of an electronic component cooling apparatus according to the present invention and FIGS. 4 to 6 show a fan unit mounting frame incorporated in an electronic component cooling apparatus of the illustrated embodiment. An electronic component cooling apparatus of the illustrated embodiment which is generally designated at reference numeral 1 in FIG. 1 and adapted to cool an electronic component with increased heat generation such as an MPU or the like generally includes a heat sink 3 and a fan unit 5. The fan unit 5 is mounted on the heat sink 3. The term "first direction" used herein is intended to mean a direction perpendicular to a surface of a base described hereinafter or a vertical direction in FIG. 1 and the term "second direction" used herein is intended to mean a direction perpendicular to the first direction and along the front surface of the base. The second direction is a lateral direction in FIG. 1. The term "third direction" used herein is intended to mean a direction perpendicular to both first and second directions and a longitudinal direction of the electronic component cooling apparatus orientated in a manner as shown in FIG. 1.

The heat sink 3 generally includes a radiation fin unit 9 and a base 11. The radiation fin unit 9 includes a plurality of radiation fins 7 made of a material increased in thermal conductivity such as copper or the like. The base 11 is formed into a substantially rectangular shape and fixedly mounted thereon with the radiation fin unit 9. The radiation fin unit 9 is formed by subjecting a single metal plate which has a thickness suitable for permitting bending of the metal plate to working or machining such as bending and the like. The metal plate may be made of copper or copper alloy. More particularly, the radiation fin unit 9, as shown in FIG. 3, is constructed by successively connecting the radiation fins 7 to each other in order in such a manner that, of both ends 7a and 7b of each radiation fin 7 positioned on both sides in the first direction, one end 7a of the radiation fin positioned on one side in the first direction is connected to an end 7a of a first adjacent radiation fin 7 positioned on one side in the third direction by a first connection 13, which end 7a of the first adjacent radiation fin 7 is positioned on one side in the first direction, and the other end 7b of the radiation fin 7 positioned on the other side in the first direction is connected to an end 7b of a second adjacent radiation fin 7 positioned on the other side in the third direction by a second connection 15, which end 7b of the second adjacent radiation fin 7 is positioned on the other side in the first direction. Then, the first connection 13 is joined to the surface of the base 11 by welding. The heat sink 3 has a pair of edges positioned on both sides of the base 11 defined in the third direction, each of which edges is formed with a hook engagement 12 so as to continuously extend in the third direction.

The fan unit 5, as shown in FIG. 2, includes an impeller 19 including a plurality of blades 17 and rotated by a motor 21. The fan unit 5 is arranged on the other side in the first direction to blow air for cooling against the radiation fins 7. The motor 21 includes a housing 23 which is connected to the casing 6 of the fan unit 5 by means of three webs 25. The webs 25 each are formed at an end thereof on a side of a top plate 29 of a fan unit mounting frame 27 into a chevron-like shape.

The top plate 29 of the fan unit mounting frame 27 for mounting the fan unit 5 therein is formed with an opening 31 of a substantially annular shape through which the impeller 19 is rotatably received in the frame 27. The opening 31 also functions to constitute an air introduction hole. The opening 31 has an inner diameter slightly smaller than a width of the top plate 29 or a dimension thereof in the third direction. Such configuration causes about one of the radiation fins positioned on each of both sides in the third direction in the fan unit mounting frame 27 to be out of sight.

The top plate 29 of the fan unit mounting frame 27 is arranged outside the radiation fin unit 9 so as to define a gap sufficient to provide an air flow space S continuously extending on both sides in the second and third directions between the top plate 29 and the end 7b of each of the radiation fins 7 positioned on the other side in the first direction. The top plate 29 is provided with the air guide hole for guiding air for cooling sucked by the fan unit 5 to the air flow space S. The fan unit mounting frame 27 also includes a pair of side plates 33 and 35 which are arranged so as to extend from a pair of ends of the top plate 29 positioned on both sides in the third direction toward the base 11. The side plates 33 and 35 are arranged so as to extend substantially in parallel to the radiation fins 7 in the first and second directions. Also, the side plates 33 and 35 are arranged so as to define air gaps between two radiation fins 7 of the radiation fin unit 9 positioned on both side ends in the third direction and the side plates 33 and 35. Such arrangement permits air discharged from the fan unit 5 to flow through the air flow space S directly into the air gaps.

The fan unit mounting frame 27 further includes a pair of mounting legs 37 and 39 each connected at one end thereof to a central portion of each of the side plates 33 and 35, respectively. The mounting legs 37 and 39 are provided at the other end thereof with hooks 37a and 39a engaged with the hook engagements 12 provided on the ends or edges of the base 11 positioned on both sides in the third direction. The mounting legs 37 and 39 are arranged so as to define air gaps between two radiation fins 7 of the radiation fin unit 9 positioned on both side ends in the third direction and the mounting legs 37 and 39 just as the side plates 33 and 35 described above, so that air for cooling discharged from the fan unit 5 may flow into the air gaps thus formed. Thus, the side plates 33 and 35 and the mounting legs 37 and 39 are formed into a shape and dimensions which keep the side plates and mounting legs from fully covering side surfaces of the radiation fin unit 9 positioned on both sides in the third direction.

The side plates 33 and 35 of the fan unit mounting frame 27 include auxiliary support legs 41 and 43 in pairs arranged so as to be positioned on both sides of legs 37 and 39 or both sides in the second direction, respectively. The auxiliary support legs 41 and 43 are arranged so as to be merely abutted against a pair of edges or ends of the base 11 of the heat sink 3. Thus, the auxiliary support legs 41 and 43 are free of any hooks engaged with the ends of the base 11. Nevertheless, in order to enhance the engagement between the fan unit mounting frame 27 and the base 11, it is a matter of course that the auxiliary support legs 41 and 43 as well may be provided with hooks engaged with the hook engagements 12 of the base 11 of the heat sink 3. In this instance as well, an air gap is preferably formed between each of the mounting legs 37 and 39 and each of the auxiliary support legs 41 and 43. Arrangement of the auxiliary support legs 41 and 43 permits each of the legs 41 and 43 to act as a reinforcing member, to thereby enhance rigidity of the fan unit mounting frame 27. An excessive increase in size of the auxiliary support legs 41 and 43 substantially obstructs flow of air for cooling. In order to avoid the problem, the auxiliary support legs 41 and 43 are preferably formed into a size as large as possible while ensuring that it does not obstruct air flow.

The fan unit mounting frame 27 also includes a first pivotal movement preventing engagement structure which is engaged with the radiation fin unit 9 to prevent the top plate 29 of the fan unit mounting frame 27 from pivotally moving in the third direction, as well as a second pivotal movement preventing engagement structure which is engaged with the radiation fin unit 9 to prevent the top plate 29 from pivotally moving in the second direction. The first pivotal movement preventing engagement structure may be constituted by a plurality of projections 45 integrally mounted on the top plate 29 and each fitted, in the first direction, in each of a plurality of gaps defined between respective adjacent two of the radiation fins 7. The plural projections 45 providing the first pivotal movement preventing engagement structure, as shown in FIGS. 3, 5 and 6, are arranged on a rear surface of the top plate 29 opposite to the radiation fin unit 9 so as to form at least one projection chain 47 extending around the opening 31 constituting the air introduction hole and in the third direction. In the illustrated embodiment, two such projection chains 47 are arranged in a manner to be spaced from each other at an interval with the opening 31 being interposed therebetween (or to be spaced from each other in the second direction). The plural projections 45 constituting the projection chains 47 are arranged in correspondence to a central portion of the radiation fin unit 9. As shown in FIG. 4, when the projection chains 47 are arranged in such a manner as described above, elongated slits 49 are formed so as to continuously extend along the projection chains 47 on the outside thereof or on both sides of the second direction. The projections 45 each are formed into a shape and dimensions which permit portions 30 of the top plate 29 on which the projection chains 47 are formed to be deflected so as to project toward the other side in the first direction or in a direction away from the heat sink 3 while keeping the fan unit mounting frame 27 mounted on the heat sink 3. More particularly, the projections 45 each are formed into a width somewhat larger than a width of a gap g defined between each adjacent two of the radiation fins 7, to thereby be forcibly pushed into the gap g. This permits the portions 30 of the top plate 29 on which the projection chains 47 are formed to be deflected so as to project toward the other side in the first direction, so that the portions 30 may forced against the radiation fin unit 9. Such arrangement cooperates with engagement between the hooks 37a and 39a of the mounting legs 37 and 39 and the hook engagements 12 provided on the base 11 of the heat sink 3 to effectively prevent movement of the fan unit mounting frame 27 to the other side in the first direction. Also, when the projections 45 each are fitted in the gap g, the projection 45 is caught by the radiation fin 7 adjacent thereto to act as an anchor in the case that force toward at least one side in the third direction is applied to the fan unit mounting frame 27. This results in effectively restraining the top plate 29 from pivotally moving in the third direction.

The second pivotal movement preventing engagement structure may be constituted by a pair of protrusions 51 which are arranged so as to extend from the top plate 29 toward the base 11 and abutted against a part of end surfaces of each of the radiation fins 7 positioned on both sides in the second direction, to thereby prevent pivotal movement of the radiation fins 9 in the second direction. Such arrangement of the protrusions 51 permits each of the protrusions 51 in a pair to act as a stopper, to prevent pivotal movement of the top plate 29 of the fan unit mounting frame 27 in the second direction while being simplified in construction.

In the illustrated embodiment, as shown in FIGS. 3 and 6, a pair of elongated connection bars 53 are arranged so as to connect ends of the side plate 33 and those of the side plate 35 positioned on both sides in the second direction to each other therethrough, respectively. Such arrangement of the connection bars 53 permits each of the connection bars 53 to act as a reinforcing member, to thereby prevent a reduction of the mechanical strength of the fan unit mounting frame 27 even when the thickness of a material for the fan unit mounting frame 27 is reduced. The electronic component cooling apparatus of the illustrated embodiment further includes three short connection bars 55 arranged with respect to each of the connection bar 53 so as to connect the connection bar 53 and the top plate 29 to each other therethrough. The connection bars 53 and 55 function to enhance mechanical strength of the fan unit mounting frame 27 without substantially obstructing flow of air for cooling.

In the illustrated embodiment, the casing 6 of the fan unit 5 and the fan unit mounting frame 27 for mounting the fan unit 5 therein may be formed so as to be integral with each other. However, this causes the casing 6 and fan unit mounting frame 27 to be complicated in configuration, leading to an increase of manufacturing cost. Thus, both are preferably formed separately from each other. In the illustrated embodiment, as shown in FIG. 4, the side plates 33 and 35 of the fan unit mounting frame 27 in which the fan unit is mounted each are provided on an inner surface thereof with a hook 57 constituting an engagement structure, by which the casing 6 of the fan unit 5 is mounted in the fan unit mounting frame 27.

The electronic component cooling apparatus of the illustrated embodiment, as described above, is constructed so as to permit air for cooling discharged from the fan unit 5 to flow through the air flow space S, the gaps g, gaps defined between the side plates 33, 35 and at least a pair of mounting legs 37, 39 and side surfaces of the radiation fin unit 9 positioned on both sides in the third direction. This results in the whole radiation fin unit 9 being rapidly uniformly cooled. Also, in the illustrated embodiment, the blades 17 of the fan unit 5 each are positioned at a part thereof in the air flow space S, to thereby permit air for cooling to be fed directly to the air flow passage S, leading to an increase in cooling efficiency of the electronic component cooling apparatus. In this instance, the blades 17 of the fan unit 5 each may be preferably formed into a configuration which permits air for cooling to be discharged in the radial direction of the revolving shaft of the motor from the fan unit 5 as much as possible. Such configuration permits the air to be rapidly flowed to the air flow space S.

In the illustrated embodiment, the second pivotal movement preventing engagement structure is constituted by the protrusions 51 arranged in a pair. Alternatively, the second pivotal movement preventing engagement structure may be constituted by the connection bars 53 rather than the protrusions 51. Also, in the illustrated embodiment, the projection chains 47 each including the plural projections 45 are arranged inside the slits 49. Alternatively, the projection chains 47 may be arranged outside the slits 49. In this instance, the protrusions 51 in a pair may be arranged so as to be positioned inside the slits 49, to thereby be abutted against an end of the radiation fins 7 positioned on the other side in the first direction. Such arrangement permits a portion of the protrusions 51 positioned inside the slits 49 to be deflected while keeping the protrusions 51 abutted against the end of the radiation fins 7 on the other side in the first direction, resulting in the protrusions 51 being forced against the radiation fins 7 by means of force at a suitable magnitude, to thereby prevent the fan unit mounting frame 27 from moving toward the other side in the first direction. In this instance, the connection bars 53 may also act as the second pivotal movement preventing engagement structure.

As can be seen from the foregoing, the electronic component cooling apparatus of the present invention is constructed so as to permit air for cooling discharged from the fan unit to flow through the air flow space defined between the radiation fin unit and the top plate, the gaps defined between the radiation fins, and the gaps defined between the side plates and the outermost radiation fins of the radiation fin unit, to thereby efficiently cool the radiation fins. In particular, the present invention is so constructed that air flowing through the air flow space directly reaches the gaps between the respective adjacent two of the radiation fins. This permits air of low temperature or cold air to be rapidly fed from the fan unit to the radiation fins arranged apart from the fan unit, to thereby significantly enhance cooling efficiency of the electronic component cooling apparatus.

In particular, in the electronic component cooling apparatus of the present invention, the hooks arranged on the pair of mounting legs are engaged with the hook engagements, to thereby prevent movement of the top plate of the fan unit mounting frame in the first direction. Also, arrangement of the first pivotal movement preventing engagement structure and second pivotal movement preventing engagement structure effectively prevents the top plate from moving in the second and third directions, so that the fan unit mounting frame may be firmly mounted on the heat sink without substantially increasing mechanical strength of the fan unit mounting frame.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component cooling apparatus comprising:

a heat sink including a radiation fin unit, said radiation fin unit including a plurality of radiation fins made of a thermally conductive material and a base made of a thermally conductive material;

said base having said radiation fin unit mounted to a front surface thereof and an electronic component to be cooled mounted to a rear surface thereof;

said radiation fins being arranged so as to extend in a first direction perpendicular to said front surface of said base and in a second direction perpendicular to said first direction and along said front surface of said base;

said radiation fins being arranged so as to be spaced from each other at predetermined intervals in a third direction perpendicular to said first and second directions;

said radiation fins having one end and an other end and each being fixed at the one end thereof to said base, said one end being positioned on one side in said first direction to said base;

said base having a pair of edges that are perpendicular to said third direction, each of said pair of edges having a hook engagement;

a fan unit for feeding air for cooling to said radiation fin unit;

said fan unit including an impeller, said impeller having a plurality of blades and being rotated by a motor and arranged, with respect to said first direction, on an opposite side of said radiation fin unit; and a fan unit mounting frame made of a synthetic resin material and including a top plate for supporting said fan unit thereon, a pair of side plates and at least one pair of mounting legs;

said top plate being arranged outside said radiation fin unit so as to define a gap sufficient to define an air flow space continuously extending on both sides in said second and third directions between said top plate and an end of each of said radiation fins positioned on the other side in said first direction;

said top plate being provided with an air guide hole for guiding air drawn by said fan unit to said air flow space;

said side plates being arranged so as to extend toward said base from a pair of ends of said top plate positioned on both sides in said third direction;

said at least one pair of mounting legs each being connected at one end thereof to each of said side plates and provided at the other end thereof with a hook engaged with each of said hook engagements;

said side plates and said at least a pair of mounting legs being formed into a shape and being dimensioned to keep said side plates and mounting legs from fully covering side surfaces of said radiation fin unit positioned on both sides in said third direction;

said fan unit mounting frame including a first pivotal movement preventing engagement structure, which is engaged with said radiation fin unit to prevent said top plate from pivotally moving in said third direction, and a second pivotal movement preventing engagement structure, which is engaged with said radiation fin unit to prevent said top plate from pivotally moving in said second direction;

and wherein said first pivotal movement preventing engagement structure is constituted by one or more projections fitted, in said first direction, in one or more gaps defined between adjacent two of said radiation fins.

2. The electronic component cooling apparatus as defined in claim 1, wherein said radiation fin unit is formed from a single metal plate, said single metal plate having a thickness that permits bending thereof.

3. The electronic component cooling apparatus as defined in claim 2, wherein said radiation fin unit is constructed by connecting said radiation fins to each other in order and such that, of both ends of each of said radiation fins defined on both sides in said first direction, one end of said radiation fin positioned on said one side in said first direction is connected to an end of a first adjacent radiation fin positioned on said one side in said third direction by a first connection, and wherein one end of said first adjacent radiation fin is positioned on said one side in said first direction, and the other end of said radiation fin positioned on the other side in said first direction is connected to an end of a second adjacent radiation fin positioned on the other side in said third direction by a second connection, and wherein the end of said second adjacent radiation fin is positioned on the other side in said first direction.

4. The electronic component cooling apparatus as defined in claim 2, wherein said radiation fin unit is configured into a meandering shape such that said radiation fins each are connected at an end thereof positioned on one side in said first direction to an end of a first adjacent radiation fin positioned on said one side by a first connection and at an end thereof positioned on the other side in said first direction to an end of a second adjacent radiation fin positioned on the other side in said first direction by a second connection;

said first connection being joined to said front surface of said base.

5. The electronic component cooling apparatus as defined in claim 1, wherein said fan unit includes a casing formed separately from said fan unit mounting frame; and a plurality of said projections are arranged on said top plate so as to form at least one projection chain along a circumference of said air guide hole.

6. The electronic component cooling apparatus as defined in claim 1, wherein said second pivotal movement preventing engagement structure is constituted by a pair of projections arranged so as to extend from said top plate toward said base, to thereby be abutted against a part of end surfaces of each of said radiation fins positioned on both sides in said second direction, resulting in preventing pivotal movement of said radiation fin unit in said second direction.

7. The electronic component cooling apparatus as defined in claim 1, wherein said top plate is integrally provided thereon with a pair of protrusions in a manner to extend from said top plate toward said base, to thereby be abutted against a part of an end surface of each of said radiation fins on the other side in the first direction;

said protrusions each being formed on an outside thereof with an elongated slit so as to continuously extend along said projection chain;

said top plate being deflected at a portion thereof on which said protrusions are formed so as to project toward the other side in said first direction while keeping said fan unit mounting frame mounted on said heat sink.

8. The electronic component cooling apparatus as defined in claim 1, further comprising a pair of elongated connection bars for connecting a pair of ends of said side plates positioned on both sides in said second direction thereto, respectively;

said connection bars acting as said second pivotal movement preventing engagement structure.

9. The electronic component cooling apparatus as defined in claim 7, further comprising at least one short connection bar for connecting said connection bars and top plate to each other.

10. The electronic component cooling apparatus as defined in claim 1, wherein said air for cooling discharged from fan unit flows through said air flow space, said gaps and gaps defined between said side plates and said at least a pair of mounting legs and side surfaces of said radiation fin unit positioned on both sides in said third direction.

11. The electronic component cooling apparatus as defined in claim 10, wherein said blades of said fan unit each are positioned at a part thereof in said air flow space.

12. The electronic component cooling apparatus as defined in claim 1, wherein said legs each are connected to a central portion of each of said side plates; and said side plates have a pair of auxiliary support legs abutted against said edges of said base so as to be positioned on both sides of said legs in said second direction.

13. The electronic component cooling apparatus as defined in claim 1, wherein said fan unit is mounted on said top plate of said fan unit mounting frame through a removable engagement structure.

14. The electronic component cooling apparatus as defined in claim 1, wherein said fan motor includes a motor, an impeller rotated by said motor, a motor drive circuit for driving said motor and a temperature sensor arranged in a manner to be incorporated in or adjacent to said motor drive circuit;

said motor drive circuit controlling a rotational speed of said motor depending on an output of said temperature sensor.

15. The electronic component cooling apparatus as defined in claim 5, wherein said second pivotal movement preventing engagement structure is constituted by a pair of projections arranged so as to extend from said top plate toward said base, to thereby be abutted against a part of end surfaces of each of said radiation fins positioned on both sides in said second direction, resulting in preventing pivotal movement of said radiation fin unit in said second direction.

* * * * *

UNITED STATES PATENT AND TRADEMARK OFFICE
CERTIFICATE OF CORRECTION

PATENT NO.   : 6,480,383 B2
DATED        : November 12, 2002
INVENTOR(S)  : Yuichi Kodaira et al.

It is certified that error appears in the above-identified patent and that said Letters Patent is hereby corrected as shown below:

Title page,
Item [75], Inventors, delete "Ueda" and insert -- Ueda-shi --.
Item [56], References Cited, U.S. PATENT DOCUMENTS, in the sixth reference, delete "5,616,998" and insert -- 5,615,998 --.

Column 2,
Line 30, delete "position ing" and insert -- positioning --.

Column 13,
Line 2, delete "claim 10" and insert -- claim 9 --.

Signed and Sealed this

Fifteenth Day of April, 2003

JAMES E. ROGAN
*Director of the United States Patent and Trademark Office*